United States Patent
Chang et al.

(10) Patent No.: US 8,564,011 B2
(45) Date of Patent: Oct. 22, 2013

(54) LIGHT-EMITTING DIODE PACKAGE STRUCTURE

(75) Inventors: Kuangyao Chang, Shenzhen (CN); Weiwei Zheng, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 135 days.

(21) Appl. No.: 13/220,682

(22) Filed: Aug. 30, 2011

(65) Prior Publication Data
US 2012/0146084 A1    Jun. 14, 2012

(30) Foreign Application Priority Data
Dec. 10, 2010    (CN) .......................... 2010 1 0583563

(51) Int. Cl.
  *H01L 33/00*    (2010.01)
(52) U.S. Cl.
  USPC .............. 257/99; 257/81; 257/433; 257/434; 257/685; 257/E33.058; 438/64; 438/65; 438/66; 438/67
(58) Field of Classification Search
  None
  See application file for complete search history.

(56) References Cited

U.S. PATENT DOCUMENTS

| 7,462,871 | B2 * | 12/2008 | Han et al. ......................... 257/81 |
| 7,705,366 | B2 * | 4/2010 | Seo et al. ......................... 257/99 |
| 2007/0029564 | A1 | 2/2007 | Han et al. |
| 2010/0252842 | A1 * | 10/2010 | Tsang et al. .................... 257/89 |
| 2012/0086024 | A1 * | 4/2012 | Andrews et al. ................ 257/88 |

FOREIGN PATENT DOCUMENTS

| CN | 201421850 Y | 3/2010 |
| CN | 201655839 U | 11/2010 |
| JP | 2008085296 A | 4/2008 |
| KR | 100623576 B1 | 9/2006 |

* cited by examiner

*Primary Examiner* — Yasser Abdelaziez
(74) *Attorney, Agent, or Firm* — Cheng-Ju Chiang

(57) ABSTRACT

The present invention discloses a light-emitting diode (LED) package structure, which includes a housing, a first electrode plate, a second electrode plate, a light-emitting diode, and a voltage regulation diode. The housing has a top surface forming a cavity, and the cavity contains therein a wall that divides the cavity into a light emission section and a voltage regulation section. By separately arranging the light-emitting diode and the voltage regulation diode in two different sections of the light emission section and the voltage regulation section, the present invention prevents the voltage regulation diode from affecting light flux of the light-emitting diode by absorbing light, thereby enhancing overall lighting performance of the LED package structure.

6 Claims, 3 Drawing Sheets

LIGHT-EMITTING DIODE PACKAGE STRUCTURE

BACKGROUND OF THE INVENTION

1. Field of the Invention

The present invention generally relates to a light-emitting diode (LED) package structure, and in particular to an LED package structure that separately arranges a light-emitting die and a voltage regulation diode in different sections.

2. The Related Arts

A liquid crystal display (LCD) is a flat panel display (FPD) that uses the nature of liquid crystals to display an image and shows, as compared to other known displays, several advantages in respect of being light and thin, low drive voltage, and low power consumption, making it a main stream product in the whole consumer market. However, the liquid crystal used in the liquid crystal display does not emit light by itself and must be provided with an external light source. Consequently, a liquid crystal display is additionally combined with a backlight module to provide the desire light source.

Generally, the backlight module is classified in two forms, namely an edge type backlight module and a direct type backlight module. The existing backlight modules use a cold cathode fluorescent lamp (CCFL), a hot cathode fluorescent lamp (HCFL), or a semiconductor based lighting device to serve as a light source. The semiconductor based lighting device generally uses light-emitting diode (LED) to emit light and, as compared to the cathode fluorescent lamps, can reduce more power consumption and save more energy and has a longer service life and a compacter size, making it increasingly replace the cathode fluorescent lamps. The LEDs will be the main stream light source for the backlighting of future LCDs.

Currently, an LED is subjected to semiconductor packaging in the form of a die to make an LED package, which is eventually coupled to a retention board of a backlight module. Categories of the product package structure of LED are divided according to characteristic factors including light color, die material, brightness, and size. A single die often constructs a point light source, while a combination of multiple dies may form a planar light source or a linear light source to provide indication and display of message and status. A light-emitting display also uses multiple dies and is formed by proper connection of the dies (including series connection and parallel connection) and suitable optic structures, which constitute a light-emitting section and a light-emitting spot of the light-emitting display. Among these devices, a surface-mount-device (SMD) LED is laid flat on a surface of a circuit board, making it suitable for surface mounting technology (SMT) processing and allowing for reflow soldering so as to be capable of solving problems in association with brightness, view angle, planarity, reliability and consistency, and also making it possible to eliminate the carbon steel lead pins of the pinned LED and reduce the quantity of epoxy resin filled in the display reflective layer, due to adoption of printed circuit boards (PCBs) and reflective layer materials that are lighter. The SMD LED can easily reduce the product weight by half, making it perfect for final application. As a result, the SMD LED is increasingly replacing the pinned LED, making the application and design thereof more flexible and taking a certain share of the LED display market with a trend of accelerated development.

Reference is made to FIG. 1. FIG. 1 shows a cross-sectional view of a conventional light-emitting diode (LED) package structure. As shown in FIG. 1, a conventional LED package structure 90 comprises a housing 91, a first electrode plate 92, a second electrode plate 93, a light-emitting diode 94, a voltage regulation diode 95, and a light-transmitting package portion 96. The housing 91 has a top surface forming a cavity 911. The first electrode plate 92 has a portion exposed on a bottom of the cavity 911 and another portion extending outside the housing 91 for external electrical connection. The second electrode plate 93 has a portion exposed on the bottom of the cavity 911 and another portion extending outside the housing 91 for external electrical connection. The light-emitting diode 94 is exposed inside the cavity 911 and has a first electrode electrically connected to the first electrode plate 92 and a second electrode electrically connected to the second electrode plate 93 through a first lead 941. The light-transmitting package portion 96 fills the cavity 911 and encloses components located inside the cavity 911. Light from the light-emitting diode 94 is allowed to transmit through the light-transmitting package portion 96 for upward emission.

However, in the conventional LED package structure 90, to protect the light-emitting diode 94 from being punctured by static electricity, a single one or a set of voltage regulation diodes 95 is set in parallel connection therewith to solve the problem. Reference is made to both FIGS. 1 and 2, wherein FIG. 2 shows a schematic circuit diagram of the conventional LED package structure shown in FIG. 1. In the LED package structure 90, the voltage regulation diode 95 is set on the housing 91, namely on the second electrode plate 93, with a first electrode thereof located on the underside to electrically connect to the second electrode plate 93 and a second electrode located on the upper side electrically connected to the first electrode plate 92 through a second lead 951. In other words, the voltage regulation diode 95 and the light-emitting diode 94 are in parallel connection, wherein the voltage regulation diode 95 is arranged as being reversely biased. As such, the voltage regulation diode 95 provides a function of protecting the light-emitting diode 94 from being punctured by static electricity. However, the voltage regulation diode 95 is positioned on the second electrode plate 93, namely in the upper portion of the housing 91, and is thus located inside the light-transmitting package portion 96. Further, since the voltage regulation diode 95 has an outside appearance that is not light transmittable and is often of a black color, the voltage regulation diode 95 shows a characteristics of blocking and absorbing light, causing influence on some light flux of the light-emitting diode 94 and thus lowering the lighting performance of the LED package structure 90.

Thus, it is desired to provide an LED package structure that overcomes the existing technical problems.

SUMMARY OF THE INVENTION

A primary objective of the present invention is to provide a light-emitting diode (LED) package structure, which separately arranges a light-emitting diode and a voltage regulation diode in a light emission section and a voltage regulation section of a housing to prevent the voltage regulation diode from affecting light flux of the light-emitting diode by absorbing light, thereby raising the overall lighting performance of the LED package structure.

A secondary objective of the present invention is to provide an LED package structure, which arranges a first electrode plate and a second electrode plate to have portions thereof respectively exposed inside the light emission section and the voltage regulation section to electrically connect to the light-emitting diode located inside the light emission section and the voltage regulation diode located inside the voltage regulation section.

A further objective of the present invention is to provide an LED package structure, which arranges a heat-sink metal board to have a portion exposed inside the light emission section to allow the light-emitting diode to thermally couple to the heat-sink metal board for conducting away heat generated by the light-emitting diode.

To achieve the above objectives, the present invention provides an LED package structure, which comprises:

a housing, which has a top surface forming a cavity, the cavity containing therein a wall to divide the cavity into a light emission section and a voltage regulation section;

a first electrode plate, which has a portion exposed inside the light emission section, a portion exposed inside the voltage regulation section, and a portion extending outside the housing;

a second electrode plate, which has a portion exposed inside the light emission section, a portion exposed inside the voltage regulation section, and a portion extending outside the housing;

a light-emitting diode, which is arranged inside the light emission section and is positioned on the first electrode plate, the light-emitting diode having a first electrode electrically connected to the first electrode plate, the light-emitting diode having a second electrode electrically connected to the second electrode plate; and at least one voltage regulation diode, which is arranged inside the voltage regulation section, the voltage regulation diode having a second electrode electrically connected to the first electrode plate, the voltage regulation diode having a first electrode electrically connected to the second electrode plate.

In an embodiment of the present invention, the wall has a height that is smaller than a height of an external wall of the housing and the LED package structure comprises a package portion that is accommodated in the light emission section and the voltage regulation section of the cavity to enclose and protect the first electrode plate, the second electrode plate, and the light-emitting diode that are located inside the light emission section and to enclose and protect the first electrode plate, the second electrode plate, and the voltage regulation diode that are located inside the voltage regulation section, wherein the package portion is a light-transmitting package portion.

In an embodiment of the present invention, the wall has a height that is identical to a height of an external wall of the housing and the LED package structure comprises a first package portion and a second package portion respectively accommodated in the light emission section and the voltage regulation section. The first package portion encloses and protects the first electrode plate, the second electrode plate, and the light-emitting diode that are located inside the light emission section, and the second package portion encloses and protects the first electrode plate, the second electrode plate, and the voltage regulation diode that are located inside the voltage regulation section, wherein the first package portion that is accommodated in the light emission section is a light-transmitting package portion.

In an embodiment of the present invention, the wall has a height that is smaller than or identical to a height of an external wall of the housing.

In an embodiment of the present invention, the first electrode and the second electrode of the light-emitting diode are electrically connected to the first electrode plate and the second electrode plate inside the light emission section through conductive silver paste or a lead, respectively.

In an embodiment of the present invention, the first electrode and the second electrode of the voltage regulation diode are electrically connected to the second electrode plate and the first electrode plate inside the voltage regulation section through conductive silver paste or a lead, respectively.

To achieve the secondary objective mentioned above, the present invention provides an LED package structure, which comprises:

a housing, which has a top surface forming a cavity, the cavity containing therein a wall to divide the cavity into a light emission section and a voltage regulation section;

a first electrode plate, which has a portion exposed inside the light emission section, a portion exposed inside the voltage regulation section, and a portion extending outside the housing;

a second electrode plate, which has a portion exposed inside the light emission section, a portion exposed inside the voltage regulation section, and a portion extending outside the housing;

a heat-sink metal board, which has a portion exposed inside the light emission section and a portion extending outside the housing, the light-emitting diode being positioned on the heat-sink metal board;

a light-emitting diode, which is arranged inside the light emission section, the light-emitting diode having a first electrode electrically connected to the first electrode plate, the light-emitting diode having a second electrode electrically connected to the second electrode plate; and at least one voltage regulation diode, which is arranged inside the voltage regulation section, the voltage regulation diode having a second electrode electrically connected to the first electrode plate, the voltage regulation diode having a first electrode electrically connected to the second electrode plate.

In an embodiment of the present invention, the wall has a height that is smaller than a height of an external wall of the housing and the LED package structure comprises a package portion that is accommodated in the light emission section and the voltage regulation section of the cavity to enclose and protect the first electrode plate, the second electrode plate, the heat-sink metal board, and the light-emitting diode that are located inside the light emission section and to enclose and protect the first electrode plate, the second electrode plate, and the voltage regulation diode that are located inside the voltage regulation section, wherein the package portion is a light-transmitting package portion.

In an embodiment of the present invention, the wall has a height that is identical to a height of an external wall of the housing and the LED package structure comprises a first package portion and a second package portion respectively accommodated in the light emission section and the voltage regulation section. The first package portion encloses and protects the first electrode plate, the second electrode plate, the heat-sink metal board, and the light-emitting diode, and the second package portion encloses and protects the first electrode plate, the second electrode plate, and the voltage regulation diode that are located inside the voltage regulation section, wherein the first package portion that is accommodated in the light emission section is a light-transmitting package portion.

In an embodiment of the present invention, the wall has a height that is smaller than or identical to height of an external wall of the housing.

In an embodiment of the present invention, the first electrode and the second electrode of the light-emitting diode are electrically connected to the first electrode plate and the second electrode plate inside the light emission section through conductive silver paste or a lead, respectively.

In an embodiment of the present invention, the first electrode and the second electrode of the voltage regulation diode are electrically connected to the second electrode plate and the first electrode plate inside the voltage regulation section through conductive silver paste or a lead, respectively.

To achieve said further objective mentioned above, the present invention provides an LED package structure, which comprises:

a housing, which has a top surface forming a cavity, the cavity containing therein a wall to divide the cavity into a light emission section and a voltage regulation section;

a first electrode plate, which has a portion exposed inside the light emission section, a portion exposed inside the voltage regulation section, and a portion extending outside the housing;

a second electrode plate, which has a portion exposed inside the light emission section, a portion exposed inside the voltage regulation section, and a portion extending outside the housing;

a light-emitting diode, which is arranged inside the light emission section, the light-emitting diode having a first electrode electrically connected to the first electrode plate, the light-emitting diode having a second electrode electrically connected to the second electrode plate; and at least one voltage regulation diode, which is arranged inside the voltage regulation section, the voltage regulation diode having a second electrode electrically connected to the first electrode plate, the voltage regulation diode having a first electrode electrically connected to the second electrode plate.

In an embodiment of the present invention, the wall has a height that is smaller than a height of an external wall of the housing and the LED package structure comprises a package portion that is accommodated in the light emission section and the voltage regulation section of the cavity.

In an embodiment of the present invention, the wall has a height that is identical to a height of an external wall of the housing and the LED package structure comprises a first package portion and a second package portion respectively accommodated in the light emission section and the voltage regulation section.

In an embodiment of the present invention, the wall has a height that is smaller than or identical to height of an external wall of the housing.

In an embodiment of the present invention, the first electrode and the second electrode of the light-emitting diode are electrically connected to the first electrode plate and the second electrode plate inside the light emission section through conductive silver paste or a lead, respectively.

In an embodiment of the present invention, the first electrode and the second electrode of the voltage regulation diode are electrically connected to the second electrode plate and the first electrode plate inside the voltage regulation section through conductive silver paste or a lead, respectively.

The LED package structure of the present invention separately arranges the light-emitting diode and the voltage regulation diode in the light emission section and the voltage regulation section of the housing so as to prevent the voltage regulation diode from affecting light flux of the light-emitting diode by absorbing light, thereby enhancing overall lighting performance of the LED package structure.

DETAILED DESCRIPTION OF PREFERRED EMBODIMENTS

For better and easier understanding of the above mentioned objectives, features, and advantages of the present invention, a detailed description of the present invention will be described as follows with respect to certain preferred embodiments thereof, reference being had to the attached drawings.

Figure 1:
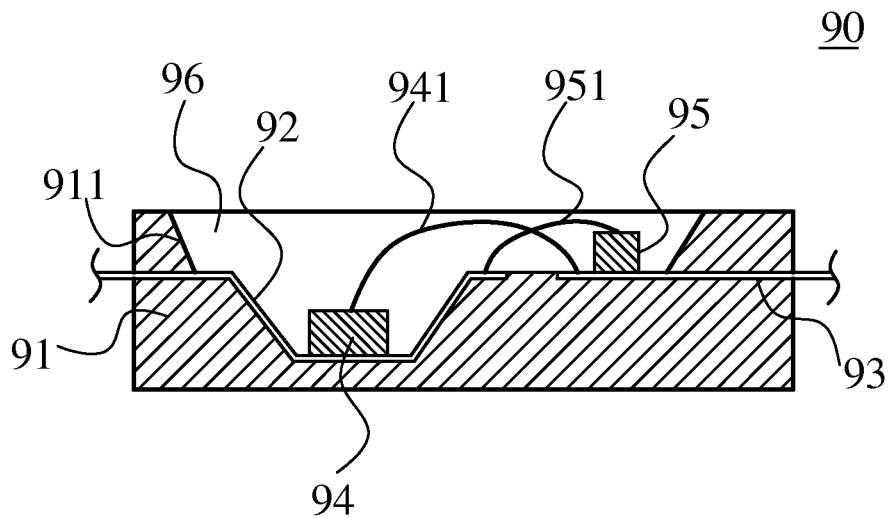
FIG. 1 shows a cross-sectional view of a conventional light-emitting diode (LED) package structure.
Figure 2:
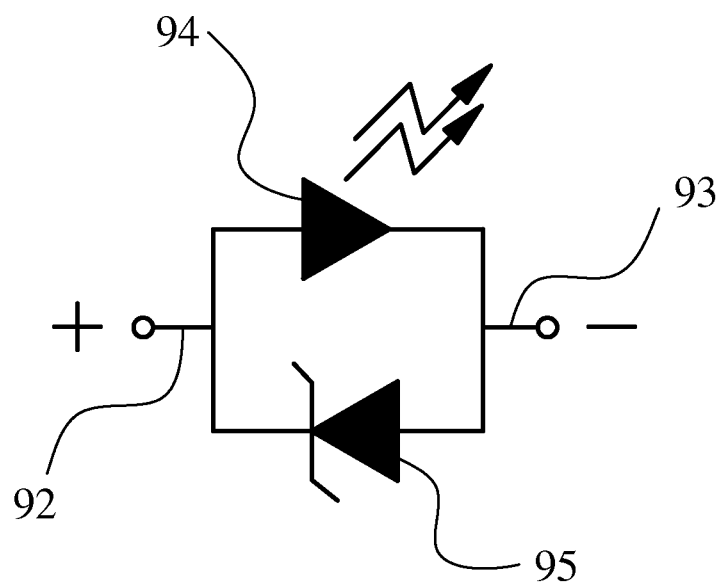
FIG. 2 shows a schematic circuit diagram for the conventional LED package structure shown in FIG. 1.
Figure 3:
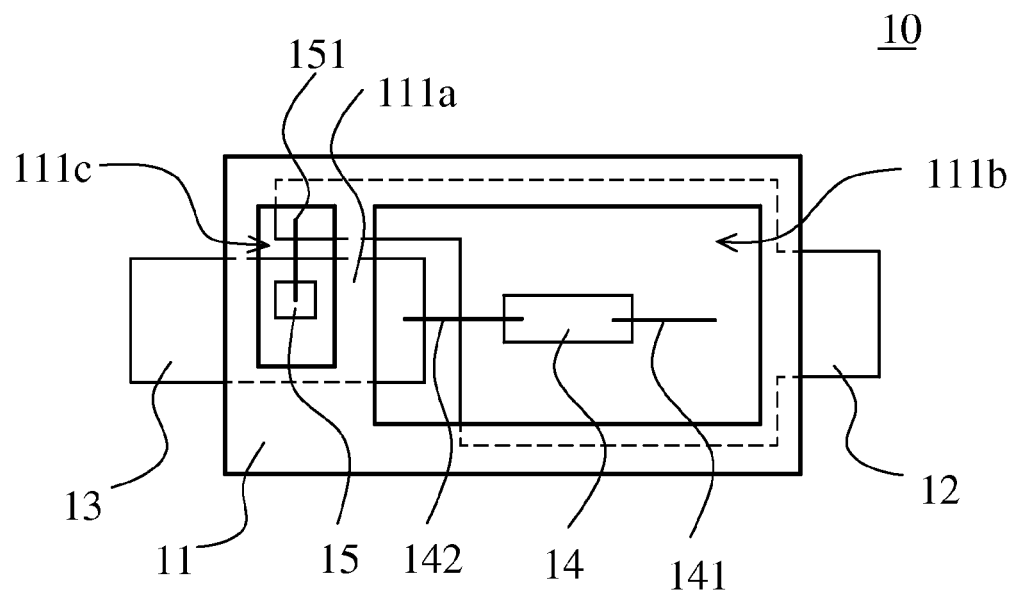
FIG. 3 shows a top plan view of an LED package structure according to a first embodiment of the present invention.
Figure 4:
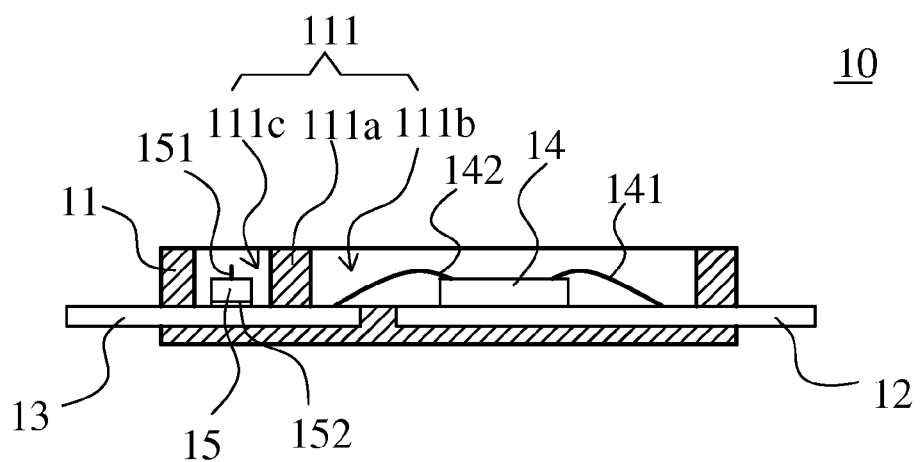
FIG. 4 shows a cross-sectional view of the LED package structure according to the first embodiment of the present invention.

Reference is now made to both FIGS. 3 and 4. FIG. 3 shows a top plan view of a light-emitting diode (LED) package structure according to a first embodiment of the present invention, and FIG. 4 shows a cross-sectional view of the LED package structure according to the first embodiment of the present invention. As shown in FIGS. 3 and 4, the LED package structure 10 according to the first embodiment of the present invention comprises: a housing 11, a first electrode plate 12, a second electrode plate 13, a light-emitting diode 14, and a voltage regulation diode 15. The housing 11 has a top surface forming a cavity 111. The cavity 111 is of a recessed configuration and is shown in a basic form in FIGS. 3 and 4, but can be of a specific configuration formed as desired. The cavity 111 contains therein a wall 111a, and the wall 111a divides the cavity 111 into a light emission section 111b and a voltage regulation section 111c. The wall 111a can be additionally mounted in the cavity 111 or alternatively be integrated with the housing 11.

Further, the first electrode plate 12 has a portion exposed on bottom of the light emission section 111b, a portion exposed on bottom of the voltage regulation section 111c, and a portion extending outside the housing 11 for external electrical connection; the second electrode plate 13 has a portion exposed on the bottom of the light emission section 111b, a portion exposed on the bottom of the voltage regulation section 111c, and a portion extending outside the housing 11 for external electrical connection.

Further, the light-emitting diode 14 is arranged inside the light emission section 111b and is positioned on the first electrode plate 12. The light-emitting diode 14 has a first electrode (not labeled) and a second electrode (not labeled). The first electrode is electrically connected to the first electrode plate 12, and the second electrode is electrically connected to the second electrode plate 13; in the instant embodiment, the light-emitting diode 14 is preferably electrically connected to the first electrode plate 12 and the second electrode plate 13 inside the light emission section 111b through conductive silver paste or leads, respectively. As shown in FIGS. 3 and 4, a feasible arrangement for the first embodiment of the present invention is that the first electrode of the light-emitting diode 14 is electrically connected through a lead 141 to the first electrode plate 12, and the second electrode is electrically connected through a lead 142 to the second electrode plate 13. However, the present invention is not limited to this. For example, in another feasible embodiment, the first electrode of the light-emitting diode 14 is located on an underside and is directly bonded to the first electrode plate 12 by conductive silver paste for electrical connection.

Further, the voltage regulation diode 15 is arranged inside the voltage regulation section 111c. The voltage regulation diode 15 also has a first electrode (not labeled) and a second electrode (not labeled). The second electrode is electrically connected to the first electrode plate 12, and the first electrode is electrically connected to the second electrode plate 13. The voltage regulation diode 15 is preferably electrically connected to the first electrode plate 12 and the second electrode plate 13 inside the voltage regulation section 111c through conductive silver paste or leads. As shown in FIGS. 3 and 4, a feasible arrangement for the first embodiment of the present invention is that the second electrode of the voltage regulation diode 15 is electrically connected through a lead 151 to the first electrode plate 12, and the first electrode is electrically connected through conductive silver paste 152 to the second electrode plate 13. However, the present invention is not limited to this and in another feasible embodiment, the first electrode of the voltage regulation diode 15 is electrically connected through a lead to the second electrode plate 13. As shown in FIG. 4, the wall 111a has a height that is substantially identical to a height of an external wall of the housing 11, whereby the light emission section 111b and the voltage regulation section 111c are completely isolated from each other by the wall 111a. As such, the LED package structure 10 comprises a first package portion and a second package portion (not labeled), which are respectively accommodated in the light emission section 111b and the voltage regulation section 111c. The first package portion encloses and protects the first electrode plate 12, the second electrode plate 13, and the light-emitting diode 14 that are located inside the light emission section 111b, and the second package portion encloses and protects the first electrode plate 12, the second electrode plate 13, and the voltage regulation diode 15 that are located inside the voltage regulation section 111c. The first package portion that encloses the light emission section 111b must be a light-transmitting package, of which the material is suitable for packaging and allows light to transmit therethrough, such as epoxy resin. This allows the light emitted from the light-emitting diode 14 to transmit through the package portion for upward emission.

However, the packaging of the present invention is not limited to this. In another feasible embodiment, the wall 111a has a height that is smaller than the height of an external wall of the housing 11, whereby a single package portion that encloses both the light emission section 111b and the voltage regulation section 111c is needed for the LED package structure 10. It is apparent that under this situation, the package portion must be a light-transmitting one.

Further, to protect the light-emitting diode 14 from being punctured by static electricity, at least one voltage regulation diode 15 is provided, and the polarity arrangement of the voltage regulation diode 15 is such that the second electrode (not labeled) is on the upper side, while the first electrode (not labeled) is on the lower side. The lower-side first electrode of the voltage regulation diode 15 is electrically connected to the second electrode plate 13 through conductive silver paste 152, while the upper side of the voltage regulation diode 15 is electrically connected to the first electrode plate 12 through a lead 151, whereby the voltage regulation diode 15 and the light-emitting diode 14 are in parallel connection and the voltage regulation diode 15 is reversely biased. However, the present invention is not limited to this and the voltage regulation diode 15 can be made in various forms and electrically connected to the first electrode plate 12 or the second electrode plate 13 through various arrangements. In a feasible embodiment, the voltage regulation diode 15 is made in such a form that both the first electrode and the second electrode are located on the upper side and are both electrically connected to the first electrode plate 12 and the second electrode plate 13 through leads.

In summary, in the LED package structure 10 according to the present invention, since the light-emitting diode 14 and the voltage regulation diode 15 are separated in different sections (the light emission section 111b and the voltage regulation section 111c) by the wall 111a, regardless if the height of the wall 111a is identical to that of the external wall of the housing 11 (namely whether the light emission section 111b and the voltage regulation section 111c are completely or partially separated by the wall 111a). The wall 111a provides a function of isolating the voltage regulation diode 15 from the light-emitting diode 14, so as to prevent the voltage regulation diode 15 from affecting light flux of the light-emitting diode 14 by absorbing light, thereby raising the overall lighting performance of the LED package structure 10.

Further, the present invention does not specifically set the polarities of the first electrodes, the second electrodes, the first electrode plate 12, and the second electrode plate 13. In a regular application, the first electrode can be an anode (positive electrode), while the second electrode is a cathode (negative electrode), or can alternatively be any combination and correspondence of all the polarities. In addition, although the LED package structure 10 shown in the first embodiment of the present invention comprises a single voltage regulation diode 15, yet the present invention does not impose any limitation to the number of the voltage regulation diode 15 and, if desired, a user may add multiple voltage regulation diodes 15.

Figure 5:
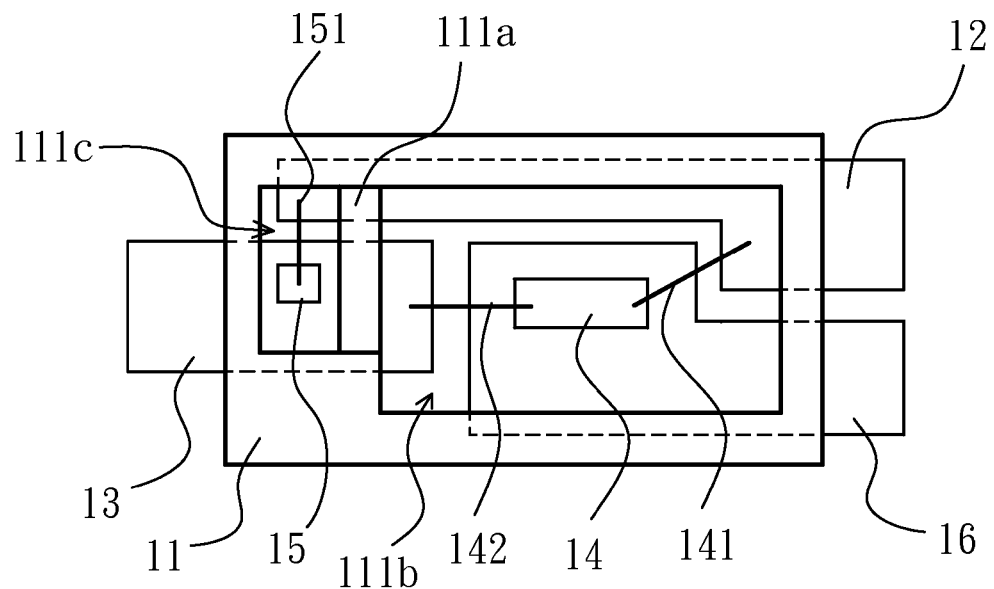
FIG. 5 shows a top plan view of an LED package structure according to a second embodiment of the present invention.
Figure 6:
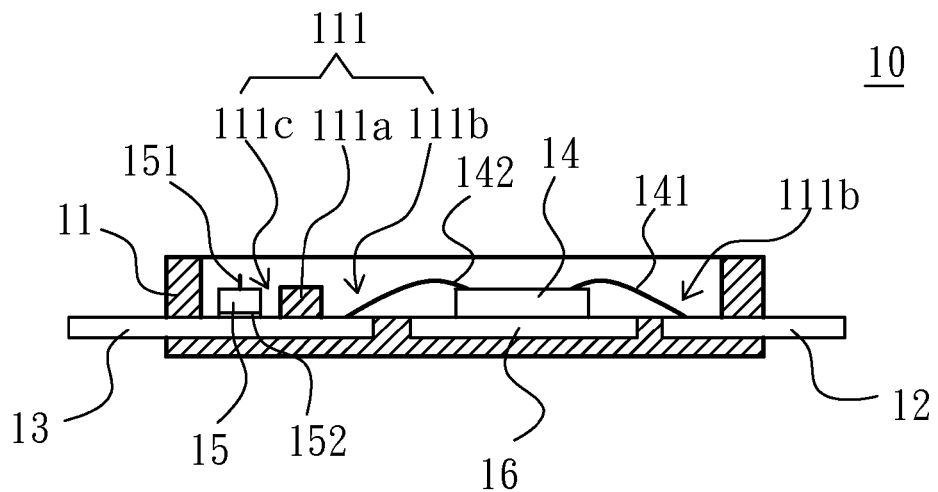
FIG. 6 shows a cross-sectional view of the LED package structure according to the second embodiment of the present invention.

Reference is further made to FIGS. 5 and 6. FIG. 5 shows a top plan view of an LED package structure according to a second embodiment of the present invention, and FIG. 6 shows a cross-sectional view of the LED package structure according to the second embodiment of the present invention. As shown in FIGS. 5 and 6, the LED package structure 10 according to the second embodiment of the present invention is similar to the LED package structure 10 of the first embodiment of the present invention, whereby same reference numerals and similar part terminology may be used, but a difference is that the LED package structure 10 of the second embodiment of the present invention further comprises a heat-sink metal board 16. The heat-sink metal board 16 has a portion exposed inside the light emission section 111b and another portion extending outside the housing 11. Further, the light-emitting diode 14 is positioned on the heat-sink metal board 16. The light-emitting diode 14 is electrically connected through the lead 141 and the lead 142 to the first electrode plate 12 and the second electrode plate 13. A bottom of the light-emitting diode 14 is positioned on the heat-sink metal board 16 and a portion of the heat-sink metal board 16 extends outside the housing 11, whereby heat generated by the light-emitting diode 14 is conducted outside the LED package structure 10 through the heat-sink metal board 16, realizing an electricity/heat separated arrangement.

Further, in the second embodiment of the present invention, the wall 111a has a height that is smaller than a height of an external wall of the housing 11, and the LED package structure 10 comprises a single package portion that encloses both the light emission section 111b and the voltage regulation section 111c in order to protect the first electrode plate 12, the second electrode plate 13, the heat-sink metal board 16, and the light-emitting diode 14 that are located inside the light emission section 111b and also to protect the first electrode plate 12, the second electrode plate 13, and the voltage regulation diode 15 that are located inside the voltage regulation section 111c, and the package portion is a light-transmitting one.

In the second embodiment of the present invention, the height of the wall 111a can alternatively be set identical to the height of the external wall of the housing 11, whereby the LED package structure comprises a first package portion (not labeled) and a second package portion (not labeled), which are respectively accommodated in the light emission section 111b and the voltage regulation section 111c. The first package portion encloses and protects the first electrode plate 12, the second electrode plate 13, the heat-sink metal board 16, and the light-emitting diode 14 that are located inside the light emission section, and the second package portion encloses and protects the first electrode plate 12, the second electrode plate 13, and the voltage regulation diode 15 that are located inside the voltage regulation section 111c. The first package portion is a light-transmitting one.

Further, although the present invention shows an arrangement of first electrode plate 12 and second electrode plate 13 in FIGS. 3 and 4 and also shows another arrangement of first electrode plate 12, second electrode plate 13, and heat-sink metal board 16 in FIGS. 5 and 6, the present invention is not limited to these, for a user may design the arrangement of the first electrode plate 12, the second electrode plate 13, and the heat-sink metal board 16 as practically desired, in combination with any feasible arrangement that positions the light-emitting diode 14 and the voltage regulation diode 15 on the first electrode plate 12, the second electrode plate 13, or the heat-sink metal board 16.

In summary, as compared to the conventional LED package structure where the voltage regulation diode is set in an upper portion of the housing and may affect some light flux of the light-emitting diode thereby lowering the lighting performance of the LED package structure, the present invention provides an LED package structure 10 of which the cavity 111 contains therein a wall 111a and is divided into a light emission section 111b and a voltage regulation section 111c with a light-emitting diode 14 and a voltage regulation diode 15 being respectively arranged in different sections to prevent the voltage regulation diode 15 from affecting light flux of the light-emitting diode 14 by absorbing light, thereby raising the overall lighting performance of the LED package structure 10.

Although the present invention has been described with reference to the embodiments, these embodiments illustrate only examples of practicing the present invention. It is noted that the disclosed embodiments are not intended to constrain the scope of the present invention, and any modification and equivalent that fall in the sprit and scope of the present invention defined by the appended claims are considered within the scope of the present invention.

What is claimed is:

1. A light-emitting diode (LED) package structure, wherein the LED package structure comprises:
    a housing, which has a top surface forming a cavity, the cavity containing therein a wall to divide the cavity into a light emission section and a voltage regulation section;
    a first electrode plate, which has a portion exposed inside the light emission section, a portion exposed inside the voltage regulation section, and a portion extending outside the housing;
    a second electrode plate, which has a portion exposed inside the light emission section, a portion exposed inside the voltage regulation section, and a portion extending outside the housing;
    a heat-sink metal board, which has a portion exposed inside the light emission section and a portion extending outside the housing, the light-emitting diode being positioned on the heat-sink metal board;
    a light-emitting diode, which is arranged inside the light emission section, the light-emitting diode having a first electrode electrically connected to the first electrode plate, the light-emitting diode having a second electrode electrically connected to the second electrode plate; and
    at least one voltage regulation diode, which is arranged inside the voltage regulation section, the voltage regulation diode having a second electrode electrically connected to the first electrode plate, the voltage regulation diode having a first electrode electrically connected to the second electrode plate.

2. The LED package structure as claimed in claim 1, wherein the wall has a height that is smaller than a height of an external wall of the housing and the LED package structure comprises a package portion that is accommodated in the light emission section and the voltage regulation section of the cavity to enclose and protect the first electrode plate, the second electrode plate, the heat-sink metal board, and the light-emitting diode that are located inside the light emission section and to enclose and protect the first electrode plate, the second electrode plate, and the voltage regulation diode that are located inside the voltage regulation section, wherein the package portion is a light-transmitting package portion.

3. The LED package structure as claimed in claim 1, wherein the wall has a height that is identical to a height of an external wall of the housing and the LED package structure comprises a first package portion and a second package portion respectively accommodated in the light emission section and the voltage regulation section, the first package portion enclosing and protecting the first electrode plate, the second electrode plate, the heat-sink metal board, and the light-emitting diode, the second package portion enclosing and protecting the first electrode plate, the second electrode plate, and the voltage regulation diode that are located inside the voltage regulation section, wherein the first package portion that is accommodated in the light emission section is a light-transmitting package portion.

4. The LED package structure as claimed in claim 1, wherein the wall has a height that is smaller than or identical to a height of an external wall of the housing.

5. The LED package structure as claimed in claim 1, wherein the first electrode and the second electrode of the light-emitting diode are electrically connected to the first electrode plate and the second electrode plate inside the light emission section through conductive silver paste or a lead, respectively.

6. The LED package structure as claimed in claim 1, wherein the first electrode and the second electrode of the voltage regulation diode are electrically connected to the second electrode plate and the first electrode plate inside the voltage regulation section through conductive silver paste or a lead, respectively.

* * * * *